(12) United States Patent
Nie

(10) Patent No.: US 10,037,736 B2
(45) Date of Patent: Jul. 31, 2018

(54) LIQUID CRYSTAL DEVICES (LCDS) AND THE ORGANIC LIGHT EMITTING DIODES (OLEDS) COMPENSATION CIRCUITS THEREOF

(71) Applicant: Shenzhen China Star Optoelectronics Technology Co., Ltd., Shenzhen, Guangdong (CN)

(72) Inventor: Chenglei Nie, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 161 days.

(21) Appl. No.: 15/106,269

(22) PCT Filed: May 10, 2016

(86) PCT No.: PCT/CN2016/081504
§ 371 (c)(1),
(2) Date: Jun. 17, 2016

(87) PCT Pub. No.: WO2017/156845
PCT Pub. Date: Sep. 21, 2017

(65) Prior Publication Data
US 2018/0082647 A1 Mar. 22, 2018

(30) Foreign Application Priority Data
Mar. 15, 2016 (CN) .......................... 2016 1 0147909

(51) Int. Cl.
*G09G 3/36* (2006.01)
*H01L 29/786* (2006.01)

(52) U.S. Cl.
CPC ....... *G09G 3/36* (2013.01); *G09G 2300/0819* (2013.01); *H01L 29/78648* (2013.01)

(58) Field of Classification Search
CPC ......... G09G 3/3233; G09G 2300/0819; G09G 2300/0852; G09G 2300/0861; G09G 2320/043; G09G 2300/0426; G09G 2310/08; G09G 2320/0233
See application file for complete search history.

(56) References Cited

U.S. PATENT DOCUMENTS

| | | |
|---|---|---|
| 2007/0182671 A1 | 8/2007 | Nathan et al. |
| 2011/0273419 A1 | 11/2011 | Park et al. |
| 2012/0327058 A1 | 12/2012 | Minami et al. |
| 2013/0285561 A1 | 10/2013 | Kitadani et al. |

(Continued)

FOREIGN PATENT DOCUMENTS

| | | |
|---|---|---|
| CN | 1862340 A | 11/2006 |
| CN | 103123773 A | 5/2013 |
| JP | 2008039893 A | 2/2006 |

*Primary Examiner* — Stacy Khoo
(74) *Attorney, Agent, or Firm* — Andrew C. Cheng

(57) ABSTRACT

The present disclosure relates to a liquid crystal device and the compensation circuit for organic light emitting diodes (OLEDs) thereof. The compensation circuit of the OLED includes a first switch unit, a second switch unit, a third switch unit, and a fourth switch unit. When the first switch unit and the second switch unit are turned off and the third switch unit and the fourth switch unit are turned on, the compensation circuit drives the OLED to emit light to compensate the OLED. With such configuration, the current passing through the OLED is prevented from being drifted caused by the threshold voltage of the TFT.

16 Claims, 2 Drawing Sheets

(56) References Cited

U.S. PATENT DOCUMENTS

| | | |
|---|---|---|
| 2014/0070184 A1 | 3/2014 | Shin |
| 2014/0168194 A1 | 6/2014 | Kong et al. |
| 2015/0162393 A1 | 6/2015 | Kang et al. |
| 2015/0372070 A1 | 12/2015 | Yoon et al. |
| 2017/0140704 A1 | 5/2017 | Cai |

LIQUID CRYSTAL DEVICES (LCDS) AND THE ORGANIC LIGHT EMITTING DIODES (OLEDS) COMPENSATION CIRCUITS THEREOF

BACKGROUND OF THE INVENTION

1. Field of the Invention

The present disclosure relates to liquid crystal display technology, and more particularly to a LCD and the OLED compensation circuits.

2. Discussion of the Related Art

OLEDs are current light emitting components. Conventional OLED driving circuits include two thin film transistors (TFTs) and one capacitor. The two TFTs include a switch TFT and a driving TFT. The switch TFT is configured for controlling the input of the data signals, and the driving TFT is configured for controlling the current passing through the OLED. When the data signals are the same, positive drifting or negative drifting of the threshold voltage of the driving TFT results in different current passing through the OLED.

Currently, threshold voltage drifting may occur during the operations of the TFTs, such as radiation of oxide semiconductor and voltage stress effects of source/drain electrodes, which may result in that the current passing through the OLED is not enough.

SUMMARY

The present disclosure relates to a LCD and the OLED compensation circuits thereof to solve the above issues.

In one aspect, a compensation circuit for organic light emitting diodes (OLEDs), the compensation circuit couples with at least one OLED, the compensation circuit includes: a first switch unit, a first end of the first switch unit couples with data signals, a second end of the first switch unit couples with first clock signals; a second switch unit, a first end of the second switch unit couples with a first reference voltage, and a second end of the second switch unit couples with second clock signals; a third switch unit, a first end of the third switch unit couples with a third end of the second switch unit, a second end of the third switch unit couples with a third end of the first switch unit, and a third end of the third switch unit couples with the OLED; a fourth switch unit, a first end of the fourth switch unit couples with a second reference voltage, a second end of the fourth switch unit couples with a predetermined voltage, a third end of the fourth switch unit couples with the OLED, and a fourth end of the fourth switch unit couples with a fourth end of the third switch unit; and when the first switch unit and the second switch unit are turned off and the third switch unit and the fourth switch unit are turned on, the compensation circuit drives the OLED to emit light to compensate the OLED.

Wherein when the OLED emits the light, a current of the OLED satisfies the equation: $I=\beta*(Vpre-Vdata)^2$; wherein I is the current of the OLED, Vdata is a voltage of the data signals, and Vpre is a predetermined voltage.

Wherein the first switch unit includes a first thin film transistor (TFT), a first end of the first TFT connects to the data signals, and a second end of the first TFT connects to the first clock signals; and the second switch unit includes a second TFT, a first end of the second TFT connects to a first reference voltage, and a second end of the second TFT connects to the second clock signals.

Wherein the third switch unit includes a third TFT and a capacitor, a first end of the third transistor connects to a third end of the second TFT, a second end of the third TFT connects a the third end of the first TFT, a third end of the third TFT connects to a positive end of the OLED, one end of the capacitor connects to the first end and a fourth end of the third transistor, and the other end of the capacitor is grounded.

Wherein the fourth switch unit includes a fourth TFT, a first end of the fourth TFT connects to the second reference voltage, a second end of the fourth TFT connects to the predetermined voltage, a third end of the fourth TFT connects to the positive end of the OLED, and a fourth end of the fourth TFT connects to the fourth end of the third TFT.

Wherein the third TFT and the fourth TFT are dual-gate TFTs, the first end of the third TFT is a drain of the dual-gate TFT, the second end of the third TFT is a bottom gate of the dual-gate TFT, the third end of the third TFT is a source of the dual-gate TFT, and the fourth end of the third TFT is a top gate of the dual-gate TFT.

Wherein when the compensation circuit pre-charges the OLED, the first clock signals are at the low level, the second clock signals are at the high level, and the data signals are at the low level, the first TFT is turned off, and the second TFT is turned on.

Wherein when the compensation circuit programs the OLED, the first clock signals are at the high level, the second clock signals are at the low level, and the data signals are at the high level, the first TFT is turned on, the second TFT is turned off, and the third TFT is turned on.

Wherein when the compensation circuit drives the OLED, the first clock signals are at the low level, the second clock signals are at the low level, and the data signals are at the low level, the first TFT is turned off, the second TFT is turned off, the third TFT is turned on, and the fourth TFT is turned on.

In another aspect, a liquid crystal device (LCD) includes: at least one OLED and a compensation circuit, the compensation circuit couples with the OLED, the compensation circuit includes: a first switch unit, a first end of the first switch unit couples with data signals, a second end of the first switch unit couples with first clock signals; a second switch unit, a first end of the second switch unit couples with a first reference voltage, and a second end of the second switch unit couples with second clock signals; a third switch unit, a first end of the third switch unit couples with a third end of the second switch unit, a second end of the third switch unit couples with a third end of the first switch unit, and a third end of the third switch unit couples with the OLED; a fourth switch unit, a first end of the fourth switch unit couples with a second reference voltage, a second end of the fourth switch unit couples with a predetermined voltage, a third end of the fourth switch unit couples with the OLED, and a fourth end of the fourth switch unit couples with a fourth end of the third switch unit; and when the first switch unit and the second switch unit are turned off and the third switch unit and the fourth switch unit are turned on, the compensation circuit drives the OLED to emit light to compensate the OLED.

Wherein when the OLED emits the light, a current of the OLED satisfies the equation: $I=\beta*(Vpre-Vdata)^2$; wherein I is the current of the OLED, Vdata is a voltage of the data signals, and Vpre is a predetermined voltage.

Wherein the first switch unit includes a first thin film transistor (TFT), a first end of the first TFT connects to the data signals, and a second end of the first TFT connects to the first clock signals; and the second switch unit includes a second TFT, a first end of the second TFT connects to a first reference voltage, and a second end of the second TFT connects to the second clock signals.

Wherein the third switch unit includes a third TFT and a capacitor, a first end of the third transistor connects to a third end of the second TFT, a second end of the third TFT connects a the third end of the first TFT, a third end of the third TFT connects to a positive end of the OLED, one end of the capacitor connects to the first end and a fourth end of the third transistor, and the other end of the capacitor is grounded.

Wherein the fourth switch unit includes a fourth TFT, a first end of the fourth TFT connects to the second reference voltage, a second end of the fourth TFT connects to the predetermined voltage, a third end of the fourth TFT connects to the positive end of the OLED, and a fourth end of the fourth TFT connects to the fourth end of the third TFT.

Wherein the third TFT and the fourth TFT are dual-gate TFTs, the first end of the third TFT is a drain of the dual-gate TFT, the second end of the third TFT is a bottom gate of the dual-gate TFT, the third end of the third TFT is a source of the dual-gate TFT, and the fourth end of the third TFT is a top gate of the dual-gate TFT.

Wherein when the compensation circuit pre-charges the OLED, the first clock signals are at the low level, the second clock signals are at the high level, and the data signals are at the low level, the first TFT is turned off, and the second TFT is turned on.

Wherein when the compensation circuit programs the OLED, the first clock signals are at the high level, the second clock signals are at the low level, and the data signals are at the high level, the first TFT is turned on, the second TFT is turned off, and the third TFT is turned on.

Wherein when the compensation circuit drives the OLED, the first clock signals are at the low level, the second clock signals are at the low level, and the data signals are at the low level, the first TFT is turned off, the second TFT is turned off, the third TFT is turned on, and the fourth TFT is turned on.

In view of the above, the first switch unit and the second switch unit are turned off and the third switch unit and the fourth switch unit are turned on, and the compensation circuit drives the OLED to emit the light so as to compensate the OLED. The current of the OLED of the LCD is stable, such that the current passing through the OLED is prevented from being drifted caused by the threshold voltage of the TFT.

DETAILED DESCRIPTION OF THE EMBODIMENTS

Embodiments of the invention will now be described more fully hereinafter with reference to the accompanying drawings, in which embodiments of the invention are shown.

Figure 1:
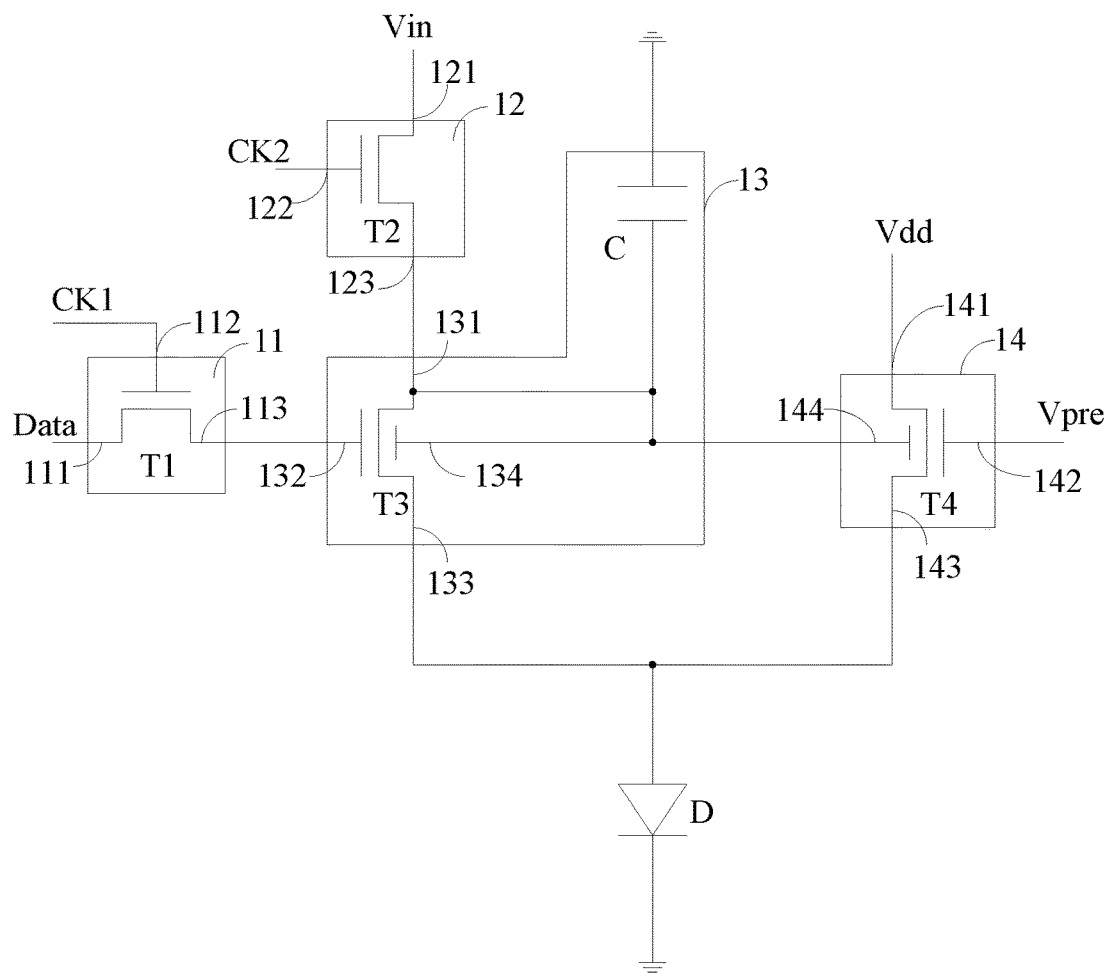
FIG. 1 is a circuit diagram of the OLED compensation circuit in accordance with one embodiment.

FIG. 1 is a circuit diagram of the OLED compensation circuit in accordance with one embodiment. The compensation circuit may be adopted by OLEDs. As shown in FIG. 1, the compensation circuit couples with OLED. The compensation circuit includes at least: a first switch unit 11, a second switch unit 12, a third switch unit 13, and a fourth switch unit 14.

In the embodiment, a first end 111 of the first switch unit 11 couples with data signals (Data). A second end 112 of the first switch unit 11 couples with first clock signals (CK1). A first end 121 of the second switch unit 12 couples with a first reference voltage (Vin), and a second end 122 of the second switch unit 12 couples with second clock signals (CK2). A first end 131 of the third switch unit 13 couples with a third end 123 of the second switch unit 12. A second end 132 of the third switch unit 13 couples with a third end 113 of the first switch unit 11. A third end 133 of the third switch unit 13 couples with an OLED (D). A first end 141 of the fourth switch unit 14 couples with a second reference voltage (Vdd), a second end 142 of the fourth switch unit 14 couples with a predetermined voltage (Vpre), a third end 143 of the fourth switch unit 14 couples with the OLED (D), and a fourth end 144 of the fourth switch unit 14 couples with the bottom 134 of the third switch unit 13.

When the first switch unit 11 and the second switch unit 12 are turned off and the third switch unit 13 and the fourth switch unit 14 are turned on, the compensation circuit drives the OLED (D) to emit lights so as to compensate the OLED (D).

Specifically, the first switch unit 11 includes a first thin film transistor (T1). The first end 111 of the first TFT (T1) connects to the data signals (Data), and the second end 112 of the first TFT (T1) connects to the first clock signals (CK1).

The second switch unit 12 includes a second TFT (T2). The first end 121 of the second TFT (T2) connects to the first reference voltage (Vin), and the second end 122 of the second TFT (T2) connects to the second clock signals (CK2).

The third switch unit 13 includes a third TFT (T3) and a capacitor (C). A first end 131 of the third TFT (T3) connects to the third end 123 of the second TFT (T2), a second end 132 of the third TFT (T3) connects to the third end 113 of the first TFT (T1), a third end 133 of the third TFT (T3) connects to a positive end of the OLED (D), one end of the capacitor (C) connects to the first end 131 and a fourth end 134 of the third TFT (T3), and the other end of the capacitor (C) is grounded.

The fourth switch unit 14 includes a fourth TFT (T4). A first end 141 of the fourth TFT (T4) connects to the second reference voltage (Vdd), a second end 142 of the fourth TFT (T4) connects to the predetermined voltage (Vpre), a third end 143 of the fourth TFT (T4) connects to the positive end of the OLED (D), and a fourth end 144 of the fourth TFT (T4) connects to the fourth end 134 of the third TFT (T3).

Preferably, the third TFT (T3) and the fourth TFT (T4) are dual-gate TFTs. The first end 131 of the third TFT (T3) is the drain of the dual-gate TFT, the second end 132 of the third TFT (T3) is the bottom gate (BG) of the dual-gate TFT, the third end 143 of the third TFT (T3) is the source of the dual-gate TFT, and the fourth end 134 of the third TFT (T3) is the top gate (TG) of the dual-gate TFT. The first end 141 of the fourth TFT (T4) is the drain of the dual-gate TFT, the second end 142 of the fourth TFT (T4) is the bottom gate (BG) of the dual-gate TFT, the third end 143 of the fourth TFT (T4) is the source of the dual-gate TFT, and the fourth end 144 of the fourth TFT (T4) is the top gate (TG) of the dual-gate TFT. The first end 111 of the first TFT (T1) is the drain, the second end 112 of the first TFT (T1) is the gate, and the third end 113 of the first TFT (T1) is the source. The first end 121 of the second TFT (T2) is the drain, the second end 122 of the second TFT (T2) is the gate, and the third end 123 of the second TFT (T2) is the source.

Figure 2:
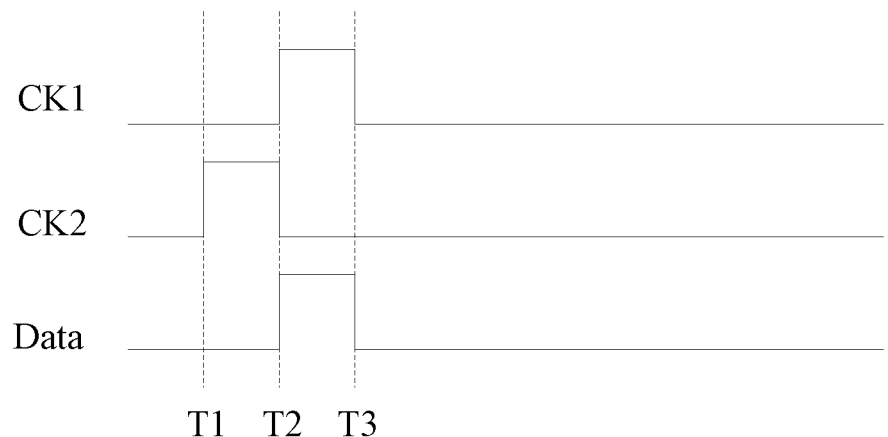
FIG. 2 is a timing diagram of the compensation circuit of FIG. 1.

FIG. 2 is a timing diagram of the compensation circuit of FIG. 1. The compensation circuit compensates the dual-gate TFT by three sections, which are respectively pre-charging the OLED (D), programming the OLED (D), and driving the OLED (D) to emit light.

When the compensation circuit pre-charges the OLED (D), as indicated by the periods between T1 and T2 in FIG. 2, the first clock signals (CK1) are at the low level, the second clock signals (CK2) are at the high level, and the data signals (Data) are at the low level. At this moment, the first TFT (T1) is turned off, the second TFT (T2) is turned on, the first end 121 of the second TFT (T2) connects to the third end 123, and the first end 131 of the third TFT (T3) connects to the fourth end 134. At this moment, the voltage (Vtg1) of the fourth end 134 of the third TFT (T3) is the first reference voltage (Vin), and the voltage (Vtg2) of the fourth end 144 of the fourth TFT (T4) is the first reference voltage (Vin). The third TFT (T3) and the fourth TFT (T4) are turned on, and the OLED (D) emit the light. The pre-charging periods T1-T2 take only a few microseconds, and the period for driving the OLED (D) to emit the light takes tens of milliseconds. Thus, the light-emitting impact of the OLED (D) caused in the pre-charging period is quite small when compared to the driving period.

When the compensation circuit programs the OLED (D), as indicated by the periods between T2 and T3 in FIG. 2, the first clock signals (CK1) are at the high level, the second clock signals (CK2) are at the low level, and the data signals (Data) are at the high level. The first TFT (T1) is turned on, the second TFT (T2) is turned off, the second end 132 of the third TFT (T3) inputs the data signals (Data), and the voltage (Vtg1) of the fourth end 134 of the third TFT (T3) is the first reference voltage (Vin). At this moment, a threshold voltage (Vth_t3) of the threshold voltage (Vth_t3) is very small, and the third TFT (T3) is turned on. When the voltage (Vtg1) of the fourth end 134 of the third TFT (T3) is gradually decreased, the threshold voltage (Vth_t3) of the third TFT (T3) is gradually increased until Vbg3−Vs=Vth_t3. The voltage (Vtg1) of the fourth end 134 of the third TFT (T3) remains the same, wherein the Vbg3 is the voltage of the second end 132 of the third TFT (T3), and the Vs is the voltage of the source of the third TFT (T3). The voltage (Vtg1) of the fourth end 134 of the third TFT (T3) is stored within the capacitor (C). At this moment, Vth_t3=Vbg3−Vs=Vdata−Voled, wherein Vdata is the voltage of the data signals (Data), and Voled is the voltage of the OLED (D). as the fourth end 144 of the fourth TFT (T4) connects to the fourth end 134 of the third TFT (T3), and the fourth TFT (T4) and the third TFT (T3) are mirror TFTs, Vth_t4 (threshold voltage of the fourth TFT (T4))=Vth_t3=Vdata−Voled, and the fourth TFT (T4) is turned on.

The programming periods T2-T2 take only a few microseconds, and the period for driving the OLED (D) to emit the light takes tens of milliseconds. Thus, the light-emitting impact of the OLED (D) caused in the programming period is quite small when compared to the driving period.

When the compensation circuit drives the OLED (D) to emit the light, as indicated by the period after T3 in FIG. 2, the first clock signals (CK1) are at the low level, the second clock signals (CK2) are at the low level, and the data signals (Data) are at the low level. The first TFT (T1) is turned off, the second TFT (T2) is turned off, the third TFT (T3) is turned on, and the fourth TFT (T4) is turned on. During the programming period, the voltage (Vtg1) of the fourth end 134 of the third TFT (T3) is maintained by the capacitor (C), such that the threshold voltages of the third TFT (T3) and the fourth TFT (T4) are Vdata-Voled. The second end 142 of the fourth TFT (T4) inputs the predetermined voltage (Vpre). According to the current equation of the TFT below:

$$I=\beta(Vbg4-Vth\_t4-Vs)^2 \quad (1)$$

Wherein Vbg4 is the predetermined voltage (Vpre) of the second end 142 of the fourth TFT (T4), and when the threshold voltage of the fourth TFT (T4)=Vdata−Voled:

$$I=\beta[Vpre-(Vdata-Voled)-Voled]^2=\beta(Vpre-Vdata)^2 \quad (2)$$

According to equation (2), the current of the OLED (D) only relative to the data signals (Data) and the predetermined voltage (Vpre). When the data signals (Data) and the predetermined voltage (Vpre) remain the same, the current of the OLED (D) is stable, which prevents the current passing through the OLED (D) from being affected by the threshold voltage of the TFT.

Figure 3:
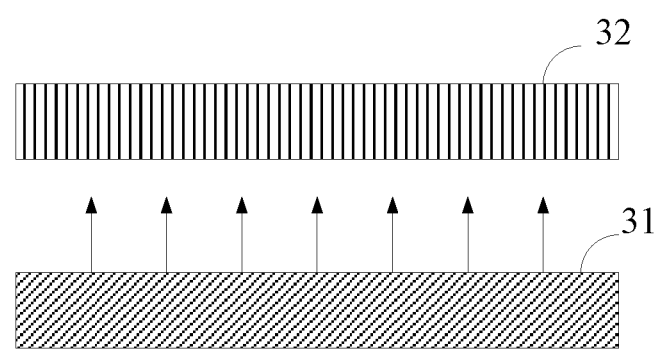
FIG. 3 is a schematic view of the LCD in accordance with one embodiment.

According to the present disclosure, as shown in FIG. 3, the LCD includes a backlight module 31 and a display panel 32 arranged on a light emitting surface of the backlight module 31, wherein the backlight module 31 includes the above OLED (D). The OLED (D) is configured to provide the light source to the backlight module 31. The backlight module 31 further includes the above compensation circuit.

The current of the OLED (D) of the LCD is stable, such that the current passing through the OLED (D) is prevented from being drifted caused by the threshold voltage of the TFT. In this way, the display panel 32 may uniformly emit the light.

In view of the above, the first switch unit and the second switch unit are turned off and the third switch unit and the fourth switch unit are turned on, and the compensation circuit drives the OLED to emit the light so as to compensate the OLED. The current of the OLED of the LCD is stable, such that the current passing through the OLED is prevented from being drifted caused by the threshold voltage of the TFT.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A compensation circuit for organic light emitting diodes (OLEDs), the compensation circuit couples with at least one OLED, the compensation circuit comprising:

a first switch unit, a first end of the first switch unit couples with data signals, a second end of the first switch unit couples with first clock signals;

a second switch unit, a first end of the second switch unit couples with a first reference voltage, and a second end of the second switch unit couples with second clock signals;

a third switch unit, a first end of the third switch unit couples with a third end of the second switch unit, a second end of the third switch unit couples with a third end of the first switch unit, and a third end of the third switch unit couples with the OLED;

a fourth switch unit, a first end of the fourth switch unit couples with a second reference voltage, a second end of the fourth switch unit couples with a predetermined voltage, a third end of the fourth switch unit couples with the OLED, and a fourth end of the fourth switch unit couples with a fourth end of the third switch unit; and when the first switch unit and the second switch unit are turned off and the third switch unit and the fourth switch unit are turned on, the compensation circuit drives the OLED to emit light to compensate the OLED.

2. The compensation circuit as claimed in claim 1, wherein the first switch unit comprises a first thin film transistor (TFT), a first end of the first TFT connects to the data signals, and a second end of the first TFT connects to the first clock signals; and the second switch unit comprises a second TFT, a first end of the second TFT connects to a first reference voltage, and a second end of the second TFT connects to the second clock signals.

3. The compensation circuit as claimed in claim 2, wherein the third switch unit comprises a third TFT and a capacitor, a first end of the third TFT connects to a third end of the second TFT, a second end of the third TFT connects a the third end of the first TFT, a third end of the third TFT connects to a positive end of the OLED, one end of the capacitor connects to the first end and a fourth end of the third TFT, and the other end of the capacitor is grounded.

4. The compensation circuit as claimed in claim 3, wherein the fourth switch unit comprises a fourth TFT, a first end of the fourth TFT connects to the second reference voltage, a second end of the fourth TFT connects to the predetermined voltage, a third end of the fourth TFT connects to the positive end of the OLED, and a fourth end of the fourth TFT connects to the fourth end of the third TFT.

5. The compensation circuit as claimed in claim 4, wherein the third TFT and the fourth TFT are dual-gate TFTs, the first end of the third TFT is a drain of the dual-gate TFT, the second end of the third TFT is a bottom gate of the dual-gate TFT, the third end of the third TFT is a source of the dual-gate TFT, and the fourth end of the third TFT is a top gate of the dual-gate TFT.

6. The compensation circuit as claimed in claim 5, wherein when the compensation circuit pre-charges the OLED, the first clock signals are at a low level, the second clock signals are at a high level, and the data signals are at the low level, the first TFT is turned off, and the second TFT is turned on.

7. The compensation circuit as claimed in claim 5, wherein when the compensation circuit programs the OLED, the first clock signals are at a high level, the second clock signals are at a low level, and the data signals are at the high level, the first TFT is turned on, the second TFT is turned off, and the third TFT is turned on.

8. The compensation circuit as claimed in claim 5, wherein when the compensation circuit drives the OLED, the first clock signals are at a low level, the second clock signals are at the low level, and the data signals are at the low level, the first TFT is turned off, the second TFT is turned off, the third TFT is turned on, and the fourth TFT is turned on.

9. A liquid crystal device (LCD), comprising:
at least one organic light emitting diode (OLED) and a compensation circuit, the compensation circuit couples with the OLED, the compensation circuit comprising:
a first switch unit, a first end of the first switch unit couples with data signals, a second end of the first switch unit couples with first clock signals;

a second switch unit, a first end of the second switch unit couples with a first reference voltage, and a second end of the second switch unit couples with second clock signals;

a third switch unit, a first end of the third switch unit couples with a third end of the second switch unit, a second end of the third switch unit couples with a third end of the first switch unit, and a third end of the third switch unit couples with the OLED;

a fourth switch unit, a first end of the fourth switch unit couples with a second reference voltage, a second end of the fourth switch unit couples with a predetermined voltage, a third end of the fourth switch unit couples with the OLED, and a fourth end of the fourth switch unit couples with a fourth end of the third switch unit; and when the first switch unit and the second switch unit are turned off and the third switch unit and the fourth switch unit are turned on, the compensation circuit drives the OLED to emit light to compensate the OLED.

10. The LCD as claimed in claim 9, wherein the first switch unit comprises a first thin film transistor (TFT), a first end of the first TFT connects to the data signals, and a second end of the first TFT connects to the first clock signals; and the second switch unit comprises a second TFT, a first end of the second TFT connects to a first reference voltage, and a second end of the second TFT connects to the second clock signals.

11. The LCD as claimed in claim 10, wherein the third switch unit comprises a third TFT and a capacitor, a first end of the third TFT connects to a third end of the second TFT, a second end of the third TFT connects a the third end of the first TFT, a third end of the third TFT connects to a positive end of the OLED, one end of the capacitor connects to the first end and a fourth end of the third TFT, and the other end of the capacitor is grounded.

12. The LCD as claimed in claim 11, wherein the fourth switch unit comprises a fourth TFT, a first end of the fourth TFT connects to the second reference voltage, a second end of the fourth TFT connects to the predetermined voltage, a third end of the fourth TFT connects to the positive end of the OLED, and a fourth end of the fourth TFT connects to the fourth end of the third TFT.

13. The LCD as claimed in claim 12, wherein the third TFT and the fourth TFT are dual-gate TFTs, the first end of the third TFT is a drain of the dual-gate TFT, the second end of the third TFT is a bottom gate of the dual-gate TFT, the third end of the third TFT is a source of the dual-gate TFT, and the fourth end of the third TFT is a top gate of the dual-gate TFT.

14. The LCD as claimed in claim 13, wherein when the compensation circuit pre-charges the OLED, the first clock signals are at a low level, the second clock signals are at a high level, and the data signals are at the low level, the first TFT is turned off, and the second TFT is turned on.

15. The LCD as claimed in claim 13, wherein when the compensation circuit programs the OLED, the first clock signals are at a high level, the second clock signals are at a low level, and the data signals are at the high level, the first TFT is turned on, the second TFT is turned off, and the third TFT is turned on.

16. The LCD as claimed in claim 13, wherein when the compensation circuit drives the OLED, the first clock signals are at a low level, the second clock signals are at the low level, and the data signals are at the low level, the first TFT is turned off, the second TFT is turned off, the third TFT is turned on, and the fourth TFT is turned on.

* * * * *